March 14, 1972 D. B. LEE 3,649,395

METHODS OF ETCHING SEMICONDUCTOR BODY SURFACES

Filed Oct. 21, 1969

INVENTOR.
DAVID B. LEE

BY
[signature]
AGENT

United States Patent Office 3,649,395

Patented Mar. 14, 1972

3,649,395

METHODS OF ETCHING SEMICONDUCTOR BODY SURFACES

David Belgrove Lee, London, England, assignor to U.S. Philips Corporation

Filed Oct. 21, 1969, Ser. No. 868,089
Claims priority, application Great Britain, Oct. 21, 1968, 49,869/68
Int. Cl. C23f *1/02;* H01l *7/00*
U.S. Cl. 156—16 9 Claims

ABSTRACT OF THE DISCLOSURE

A method of etching desired portions of a monocrystalline silicon body in which an anisotropic etch consisting of water and amine is employed and surface portions of the silicon body are protected with a coating of aluminum.

Figure 1:
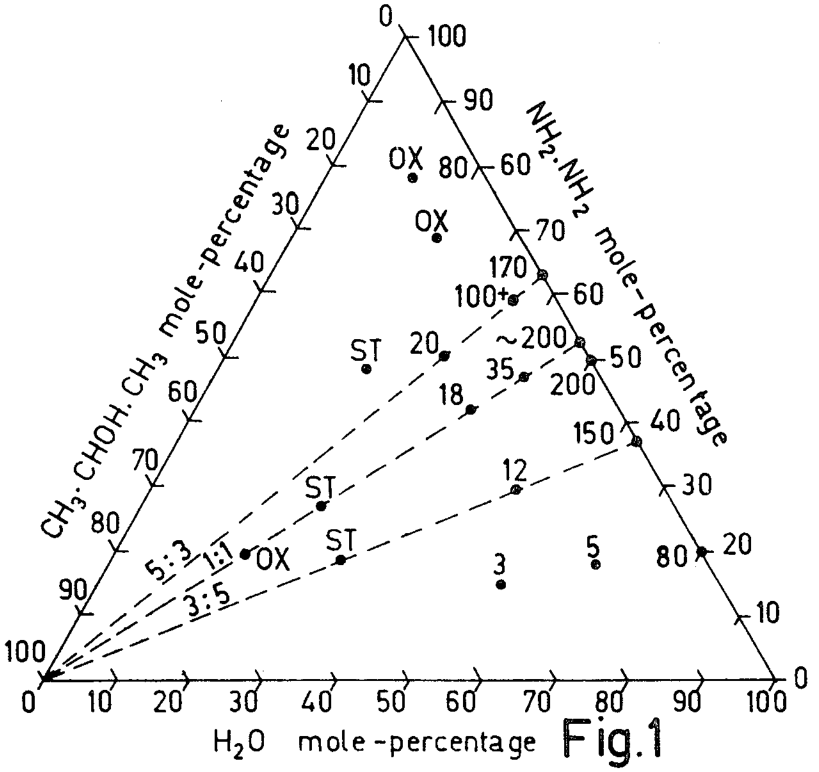

This invention relates to methods of locally etching a monocrystalline silicon body surface. It further relates to semiconductor devices when manufactured by such methods.

In the manufacture of semiconductor devices it is necessary in many processing steps to form apertures or grooves in a silicon body surface by etching. Anisotropic etching solutions have been proposed which attack the silicon body preferentially in one or more directions along those silicon crystal planes having fast etching rates to expose the set of crystal planes having a slow etching rate. In the case of silicon, the (111) crystal plane is slowest, and the (110), (100) and (211) are fast etching planes. The (100) crystal face of silicon is the only one of the major planes which the (110), (111), (100) and (211) planes intercept with symmetry in rectangular coordinates; consequently, it is usual practice when anisotropically etching silicon for the apertures to be etched in a (100) body surface.

In the fabrication of integrated circuits, anisotropic etching may be used advantageously to provide isolation channels between circuit elements in the semiconductor body, usually a silicon body. These may be used for so called air, or dielectric isolation as an alternative for the commonly used technique of p-n junction isolation; this reduces parasitic capacitance enabling high voltages to be used, and using less area of the semiconductor body for isolation purposes. Anisotropic etching may further be used for "mesa-etching" of discrete semiconductor devices, or division of semiconductor wafers into individual bodies or wafer parts. Since the etching proceeds substantially along those crystal planes having a fast etching rate, and exposing the crystal planes having a slow etching rate, it is possible to etch a well-defined aperture or groove of a depth determined by the dimensions of an opening in a protective masking layer and the orientation of the masking layer and its opening with respect to the semiconductor crystal planes.

Often it is desirable to etch comparatively deep apertures, for instance over 100 microns, in silicon in the presence of silica or aluminum layers. Such layers may eventually form part of the semiconductor device, for instance, silica as an insulating layer and aluminum as an electrical connection to electrical circuit elements in the body. In such situations it would often be desirable to have an etchant having a fast etchant rate (in excess of 150 microns per hour) for (100) silicon and for the etchant to etch silicon anisotropically and have substantially no etching effect on silica or aluminum.

Solutions of sodium hydroxide and potassium hydroxide in water are well known to etch the major planes of the silicon crystal lattice at different rates. It is also known that by adding to the potassium hydroxide solution propanol ($CH_3CHOH.CH_3$) as a complexing agent, so forming a ternary etch, it is possible to improve the anisotropic nature and the etching rate of the solution (Semiconductor Products and Solid State Technology—December 1967, page 73).

In British patent specification No. 896,669 there is disclosed and claimed an etch for etching silicon including an aromatic hydrocarbon having at least two hydroxyl groups attached to adjacent carbon atoms dissolved in a solvent having a pH in the range from approximately 9 to 12, said solvent being capable of oxidizing elemental silicon. In a preferred embodiment the etch is of a ternary nature, the aromatic hydrocarbon being catechol $C_6H_4(OH)_2$ and the solvent of required pH hydrazine ($NH_2NH_2$) and water. It has been found that such an etchant solution of catechol, hydrazine and water etches silicon anisotropically, and that a similar etchant of catechol, ethylenediamine $NH_2(CH_2)NH_2$, or other amine, and water behaves similarly (Journal Electrochemical Society—Solid State Science—September 1967, pages 965–970). In British patent specification No. 938,202 a further ternary silicon etch comprising a chelating agent, hydrazine and water is described and claimed.

Such known ternary etches are either slow in etching silicon, for instance up to 40 microns per hour at boiling point for (100) silicon, or attack certain metals (for instance aluminum) which may be an essential part of the device or otherwise used as a mask.

Potassium hydroxide, propanol and water have a fast etching rate for (100) orientated silicon, but aluminum cannot be used as a mask, as aluminum is rapidly attacked by potassium hydroxide. The dissolution rate of thermally grown silicon oxide is small of catechol, hydrazine and water or catechol, ethylendiamine and water, or chelating agent, hydrazine and water are used, but neither is the silicon rate as fast. A further disadvantage of the etchants containing catechol is its rapid attack of aluminum making such an etchant less suitable for use in the presence of that metal. Other metals used in semiconductor technology attacked by the catechol etchant are chromium and molybdenum, and there is a tendency for this etchant to detach silver layers from a semiconductor body surface. Catechol is also subject to oxidation by atmospheric oxygen resulting in discoloration in the each bath, and the oxidation products might have deleterious effects on the surface of the semiconductor device.

According to the first aspect of the invention in a method of locally etching a monocrystalline silicon body using an etchant solution consisting of an amine and water to which a moderating agent may have been added, a layer of aluminum is provided over portions of a surface of said body, the etchant solution having substantially no etching effect on said layer and attacking preferentially in one or more directions at least one portion of the surface not protected by said layer thus exposing the set of silicon crystal planes on which the etching rate is slowest.

The specified "amine" is any one substance included in the following list:

| | |
|---|---|
| Hydrazine | $NH_2NH_2$. |
| Ethylenediamine | $NH_2.CH_2.CH_2.NH_2$. |
| 1,2 propylenediamine | $NH_2.C_2.CHCH_3.N_2$. |
| 1,3 propylenediamine | $NH_2.CH_2.CH_2.CH_2.NH_2$. |
| 1,6 hexanediamine | $NH_2.(CH_2)_6NH_2$. |

The layer of aluminum may be provided solely with the object of masking the silicon surface, and may form a masking pattern having an opening to define the aperture to be etched in the silicon body surface. In this case the layer of aluminum may be removed from the silicon body surface subsequent to etching.

Alternatively, the layer of aluminum may form an essential part of a semiconductor device comprising the silicon body, for instance, the aluminum as a conducting layer and/or electrical contact. In this case, though the layer would protect the underlying portion of the silicon body surface, other portions of the silicon body surface may be protected by a layer provided specifically for masking, which is subsequently removed and which has therein the masking pattern with an opening to define the aperture to be etched in the silicon body surface. The aluminum layer though exposed to the etchant is not attacked or damaged by it and so can be used subsequently as part of the semiconductor device.

As the etchant solution must have substantially no etching effect on the layer of aluminum, it can in no form contain catechol, chelating agents, potassium hydroxide or sodium hydroxide as in the known etchant solutions.

The said diamine may be hydrazine, the etchant solution preferably comprising hydrazine and water in a substantially equal molecular ratio. Such an etchant solution has a substantially even etching rate and good controllability thus etching an aperture having an approximately equal depth and even surface.

In a modified form, the solution consists of the said diamine, water and a moderating agent whereby the semicondutcor etching rate of the solution is moderated. The percentage of moderating agent present may be chosen in accordance with the desired etching rate. The choice of moderating agent must be such that the etchant solution has substantially no effect on the layer suitable substances for the moderating agents are alcohols. In a preferred form the moderating agent is propanol s($CH_3$.CHOH.$CH_3$).

Preferably the temperature of the etchant solution during etching is that of its boiling point.

According to a preferred embodiment the layer is provided on portions of a (100) silicon plane orientated surface of the silicon semiconductor body and exposing at least one portion of said surface to the etchant solution so that the aperture or groove etched through an opening or slit in the layer has a substantially symmetrical V-shaped cross-section formed by exposing the (111) silicon planes and has a depth which is predetermined in accordance with the dimensions of the opening in the layer.

When the etchant solution consists only a hydrazine and water in substantially equal molecular ratio, the layer may be provided on a (100) plane orientated surface of the silicon semiconductor body, (100) silicon being removed at the rate of approximately 200 microns per hour.

According to a preferred embodiment at least a portion of the layer of aluminum is subsequently used for a conducting layer and/or an electrical contact to an electrical circuit element present in the body.

Etching is preferably carried out to locally remove silicon from the said silicon body surface through the thickness of the body up to the opposite body surface. In this way it would be possible to divide a silicon wafer into individual wafer parts.

A second aspect of the invention relates to a semiconductor device comprising a monocrystalline silicon body during whose manufacture formed by a method according to the first aspect of the invention has been used. The aperture or groove, when made by said etching may contain air, or may have been filled subsequently with a further material.

Figure 2:
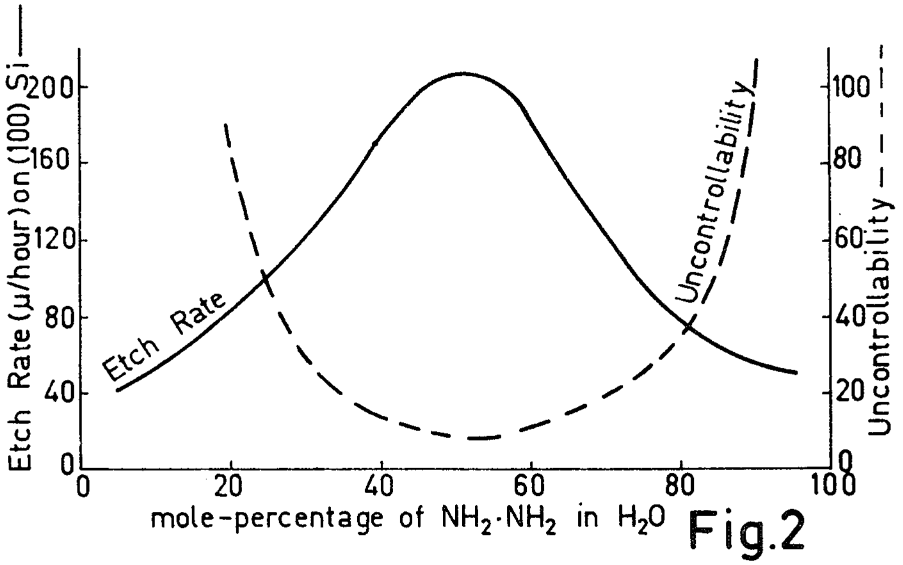

Embodiments of the invention will now be described, by way of example, with reference to FIGS. 1 and 2 of the diagrammatic drawing accompanying the provisional specification, in which:

FIG. 1 is a graphical representation of the etching rate of (100) silicon in an etching solution containing hydrazine, water and propanol in varying mole-percentages at their boiling point and at atmospheric pressure; and FIG. 2 is a graphical representation of the etching rate (full-time curve and left-hand scale in microns per hour) and uncontrollability (broken-line curve the right-hand scale) when etching (100) silicon for an etchant solution consisting only of hydrazine in varying mole-percentages in water.

In FIG. 1 the etching rate in microns per hour for a particular etchant composition is given by the number associated with that particular point on the composition graph. The letters "OX," "ST" respectively indicate that particular composition has substantially no etching effect on the (100) silicon but in the one case oxidizes the silicon surface (OX) and in the other case stains the surface (ST).

Etchant solutions comprising certain proportions of hydrazine, water and propanol are found to etch silicon anisotropically but to have substantially no etching effect on layers of silica, aluminum, silicon nitride, gold, nickel, chromium, molybdenum or silver provided on the silicon body surface. This enables such an etchant to be used with exposed layers on silica or aluminum present as well as layers of these other substances and even for aluminum to be used as making layer against the etchant solution and having openings or slits to expose the underlying semiconductor body surface and define the aperture or groove to be etched.

Etching is carried out by immersing the silicon body, in one surface of which an aperture is to be etched, in the etchant solution maintained at its boiling point at atmospheric pressure in an etching bath.

As mentioned previously, silicon wafers having their major surfaces orientated in (100) planes are considered most useful in fabricating semiconductor devices and integrated circuits; the major surfaces of the silicon wafer body are cut parallel to a (100) face to within plus or minus two degrees. A masking layer of aluminum protects those (100) surface portions of the body which it is desirous not to etch, and openings or slits in the masking layer define the apertures or grooves to be etched in the (100) silicon. The pattern of the masking layer is provided by standard photo-resist and etching techniques.

FIG. 1 shows that certain compositions of hydrazine, water and propanol appear only to stain the surface of the (100) silicon, and then to cease etching (designated "ST"), while others oxidize the silicon (OX) and in some cases produce a thicker oxide layer in the openings of the masking layer than the original thin masking layer. In general, it is found for etchant solutions of propanol, hydrazine and water, that the etching rate of (100) silicon decreases as the propanol mole-percentage increases at a given molecular ratio of hydrazine and water. The broken lines labeled 5:3, 1:1 and 3:5 in FIG. 1, designate three given approximate molecular ratios of hydrazine to water in the etchant solution, namely 5:3, 1:1 and 3:5 respectively. For the etchant solution comprising approximately 5 molecules of hydrazine to 3 molecules of water, the approximate etching rates are 170 microns/hour with no propanol, just over 100 microns/hour with 5 mole-percentage of propanol, and 20 microns/hour with 20 mole-percentage of propanol. For the etchant solution comprising 3 molecules of hydrazine to 5 molecules of water, the approximate etching rates are 150 microns/hour with no propanol, 12 microns/hour with 20 mole-percentage of propanol and only a staining of the (100) silicon surface for the solution of hydrazine and water having 50 mole-percentage of propanol.

From these experimental results, it would appear that the propanol does not act as a complexing agent and that no chelation occurs in which the propanol forms with the hydrous silica produced by etching the silicon a complex compound which is more soluble in the hydrazine solution and which increases the etching rate by the removal in this manner of the hydrous silica from the etched surface. Instead, the propanol appears to have a moderating influence on the etchant solution, the etchant solution with the fastest etching rate of approximately 200 microns/hour comprising no propanol but consisting only of hydrazine and water in a substantially equal molecular ratio.

The etching rate is dependent on the temperature of the etchant solution, which in this embodiment is its boiling point. The addition of large proportions of propanol tends to lower the boiling point of the solution to just over 80° C. By way of contrast, the etchant solution with an etching rate of approximately 200 microns/hour containing no propanol but only hydrazine and water in a substantially equal molecular ratio has a boiling point of approximately 120° C.

FIGS. 1 and 2 show that the fastest etching rate of (100) silicon for etchant solutions comprising only hydrazine and water is approximately 200 microns/hour and occurs for a substantially equal molecular ratio of hydrazine and water. For etchant solutions containing substantially 10 mole-percentage of water and 90 mole-percentage of hydrazine, and vice versa, the etching rate of (100) silicon is less than 60 microns/hour.

FIG. 2 further shows the uncontrollability of the etchant solution consisting only of hydrazine and water at various molecule percentages of hydrazine in water. The uncontrollability is a measure of the variation of depth and unevenness of the resulting bottom surface of an aperture etched in the semiconductor body, and is defined as follows:

$$\text{Uncontrollability} = 100\left(1 - \frac{d_{\text{min.}}}{d_{\text{max.}}}\right)$$

where:

$d_{\text{min.}}$=minimum depth of the etched aperture; and
$d_{\text{max.}}$=maximum depth of the etched aperture.

From the experimental results represented in FIG. 2 it is evident that the etchant solution having a fast etching speed and good controllability and evenness of etched surface comprises hydrazine and water in a substantially equal molecular ratio. For such an etchant solution with no propanol content the etching rate of (100) silicon is approximately 200 microns/hour and the uncontrollability is less than 10. Furthermore as mentioned above, and as discussed at length below, such an etchant solution has substantially no etching effect on exposed silica or aluminum layers.

In the manufacture of certain semiconductor devices it may be desirable to have an etchant solution with a somewhat slower etching rate than 200 microns/hour. In this case it seems inadvisable to alter the molecular ratio of hydrazine to water in the etchant solution as this would also affect the uncontrollability. It may also be inadvisable to lower the temperature of the etchant solution below its boiling point as this may result in inhomogeneity and hence uncontrollability of the etchant solution. However, as discussed above, propanol or other similar substances may be used as moderating agents to reduce the etching rate.

The addition of only 10 mole-percentage of propanol to a solution of hydrazine and water in substantially equal molecular ratio (see FIG. 1) is sufficient to reduce the approximate etching rate of (100) silicon from 200 microns/hour to 35 microns/hour. An etchant solution containing 20 mole-percentage of propanol has an etching rate of approximately 18 microns/hour, while solutions containing approximately 50 and 60 mole-percentages are no longer etchant solutions, but respectively stain and oxidise the silicon. However, small mole-percentages of propanol may be used to moderate the etching rate of an etchant solution without substantially affecting its controllability.

The substantial passivity of the etchant solution comprising hydrazine and water to silica or aluminum layers appears to be unaffected by the propanol content. Oxide grown in the mask opening by the laborartory atmosphere at room temperature over two weeks, about 100 A., was sufficient to completely mask against etching of the silicon beneath, while etching 25 microns in the openings of a mask on a similar silicon wafer that had been given a short dip in hydrofluoric acid to remove this small oxide layer. This implies a ratio of at least 25,000:1 for the etchant rates of (100) silicon and silica.

Layers of aluminum may be provided on the silicon body surface specifically for masking against the etchant, in which case said layer may be removed subsequent to etching, for example, when etching channels between circuit elements in the silicon body for the purpose of air or dielectric isolation. In one form of providing such isolation the major surface of the wafer at which the etching commences, is the back surface, i.e. the surface opposite that in which the semiconductor circuit elements are formed by diffusion (the front surface). The front surface is protected by a glass "handle," the purpose of which is to support the silicon body structure when channels have been etched through it. The layer of aluminum or silica is provided on portions of the back surface to mask against the etchant. Openings in the masking layer define the apertures to be etched through the silicon.

Alternatively the aluminum layers may be an essential part of the semiconductor device, such as a contacting electrode or other electrical connection. Such would act as masking layers when, for instance dividing a silicon wafer of diameter approximately two inches into bodies, or wafer parts, of size 350 microns by 350 mircons. In this case the silicon is etched from the front surface, and a support is usually provided on the back surface to maintain the order and orientation of the separated bodies.

When etching (100) silicon the cross-sectional shape of an etched aperture depends on the masking pattern and the orientation of the masking pattern with respect to the intersection of the (111) planes with the (100) surfaces. With a masking pattern having a grid structure with channel openings of 100 microns width, if the grid is aligned parallel to this intersection, the etched channel has a symmetrical V-shaped cross section, the sides making an angle of 35°±1° with the vertical and the depth being approximately 80 microns. The channel apertures are rapidly etched to this depth until the (111) planes are exposed forming the V-shaped channel walls — the (111) planes make an angle of 35° 16′ with the perpendicular to the (100) planes. After this stage is reached, the channel apertures enlarge only slowly at the etching rate of the (111) planes. It is therefore possible to predetermine the depth to which the aperture is etched by the dimensions of the mask opening.

It is noticed that, though the mask is wholly rectangular, there is a slight under-cutting of the mask and that a silicon corner so formed is distinctly bevelled and not rounded. This anisotropic etching appears to result from fast etching along the (211) planes, and this etching rate appears to be even faster than for (100) silicon planes.

What is claimed is:

1. A method of locally etching a monocrystalline silicon body comprising applying a layer of aluminum to desired portions of the surface of the silicon body and then applying to the surface of the silicon body an anisotropic etching solution consisting of an amine and water and up to 20 mole percent of a moderating agent for moderating the etching rate consisting of an alcohol thus leaving the aluminum coated surface unaffected but causing at least one portion of the silicon body surface not coated by the aluminum to be preferentially etched in at least one direction and leaving exposed the set of silicon crystal planes on which the etching solution has the slowed etching rate.

2. The method of claim 1 wherein the amine is a diamine selected from the group consisting of hydrazine, ethylendiamine, 1,2-propylenediamine, 1,3-propylenediamine and 1,6-hexanediamine.

3. The method of claim 2 wherein portions of a (100) silicon crystal plane oriented surface of the silicon body are coated with the aluminum layer and at least one slit or opening in at least one uncoated portion of said surface is exposed to the etching solution in such a manner that an aperture or groove is etched in the layer having a substantially U-shaped across section formed by exposing (111) silicon crystal planes and a depth predetermined in accordance with the dimensions of the opening or slit in the layer.

4. The method of claim 2 wherein the etching step is carried out sufficiently long so as to locally remove silicon from said silicon body surface through the thickness of the body to the opposite body surface.

5. A method of etching as claimed in claim 2, wherein the temperature of the etching solution during etching is that of its boiling point.

6. The method of claim 2 wherein a moderating agent consisting of an alcohol is present in the etching solution.

7. A method of etching as claimed in claim 6, wherein the moderating agent is propanol 2($CH_3CHOH.CH_3$).

8. A method as claimed in claim 2, wherein the said amine is hydrazine, the etchant solution comprising hydrazine and water in a substantially equal molecular ratio.

9. A method of etching as claimed in claim 8, wherein the layer is provided locally on a (100) plane orientated surface of the silicon semiconductor body, (100) silicon being removed at the rate of approximately 200 mircons per hour.

References Cited

UNITED STATES PATENTS

| | | | |
|---|---|---|---|
| 2,858,730 | 11/1958 | Hanson | 156—17 X |
| 3,160,539 | 12/1964 | Hall et al. | 156—13 X |
| 3,506,509 | 4/1970 | Kragness et al | 156—17 |
| 3,518,135 | 6/1970 | Cerniglia et al. | 156—17 |

WILLIAM A. POWELL, Primary Examiner

U.S. Cl. X.R.

156—17; 252—79.1, 79.4